(12) United States Patent
Bell et al.

(10) Patent No.: US 6,806,744 B1
(45) Date of Patent: Oct. 19, 2004

(54) HIGH SPEED LOW VOLTAGE DIFFERENTIAL TO RAIL-TO-RAIL SINGLE ENDED CONVERTER

(75) Inventors: Marshall J. Bell, Chandler, AZ (US); David B. Cooper, Chandler, AZ (US); James Kozisek, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/679,074

(22) Filed: Oct. 3, 2003

(51) Int. Cl.[7] ................................................. H03K 5/22
(52) U.S. Cl. ............................ 327/70; 327/53; 327/65
(58) Field of Search ............................. 327/52, 53, 65, 327/66, 70

(56) References Cited

U.S. PATENT DOCUMENTS

| | | | | |
|---|---|---|---|---|
| 4,539,489 A | * | 9/1985 | Vaughn | 327/206 |
| 6,429,735 B1 | * | 8/2002 | Kuo et al. | 327/563 |
| 6,433,602 B1 | * | 8/2002 | Lall et al. | 327/205 |
| 6,512,400 B1 | * | 1/2003 | Forbes | 327/66 |

OTHER PUBLICATIONS

H. Träff, "Novel Approach to High Speed CMOS Current Comparators," *Electronics Letters*, vol. 28, No. 3, 30th Jan. 1992, (3 pgs.).

William Redman–White, "A High Bandwidth Constant $g_m$ and Slew–Rate Rail–to–Rail CMOS Input Circuit and its Application to Analog Cells for Low Voltage VLSI Systems, "*IEEE vol. 32, No. 5*, May 1997 (12 pgs.).

L. Ravezzi et al., "Simple High–Speed CMOS Current Comparator," *Electronics Letters*, vol. 33, No. 22, 23rd Oct., 1997 (2 pages).

* cited by examiner

*Primary Examiner*—My-Trang Nu Ton
*Assistant Examiner*—Hiep Nguyen
(74) *Attorney, Agent, or Firm*—Brett A. Hertzberg; Merchant & Gould, P.C.

(57) ABSTRACT

A method and system is arranged to convert a differential low-voltage input signal (e.g. LVDS or RSDS) into a single-ended output signal. An operational trans-conductance amplifier (OTA) is configured to convert the input signal into a current. A trans-impedance stage is configured to convert the current into the single-ended output signal. The voltage associated with the output of the OTA corresponds to approximately VDD/2. The trans-impedance stage comprises an inverter circuit, a p-type transistor, and an n-type transistor. The transistors are arranged in a negative feedback configuration with the inverter. The single-ended output signal has a voltage swing that approximately corresponds to the sum of the $V_{GS}$ of the n-type transistor and the $V_{GS}$ of the p-type transistor. The output signal may be buffered by additional circuits such as an inverter, a Schmitt, as well as others.

20 Claims, 4 Drawing Sheets

US 6,806,744 B1

HIGH SPEED LOW VOLTAGE DIFFERENTIAL TO RAIL-TO-RAIL SINGLE ENDED CONVERTER

FIELD OF THE INVENTION

The present invention relates to converting a low voltage differential signal to a single ended signal, and, in particular, to a method and apparatus for converting a low voltage differential signal to a single ended signal using a trans-conductance amplifier that is arranged in cooperation with a trans-impedance stage.

BACKGROUND OF THE INVENTION

Low Voltage Differential Signaling (hereinafter referred to as LVDS) is a technology used in data transmission systems. In LVDS, data is transmitted over two wires as a low voltage differential signal, with half of the differential signal on each wire. A low voltage differential signal typically has peak-to-peak amplitudes in the range from 250mV to 450mV. Since LVDS is a differential signaling method, the LVDS signal does not have an absolute reference level. The low voltage swing minimizes power dissipation, while maintaining high transmission speeds. Typical transmission speeds are over 100 Mbps (Mega-bits per second).

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
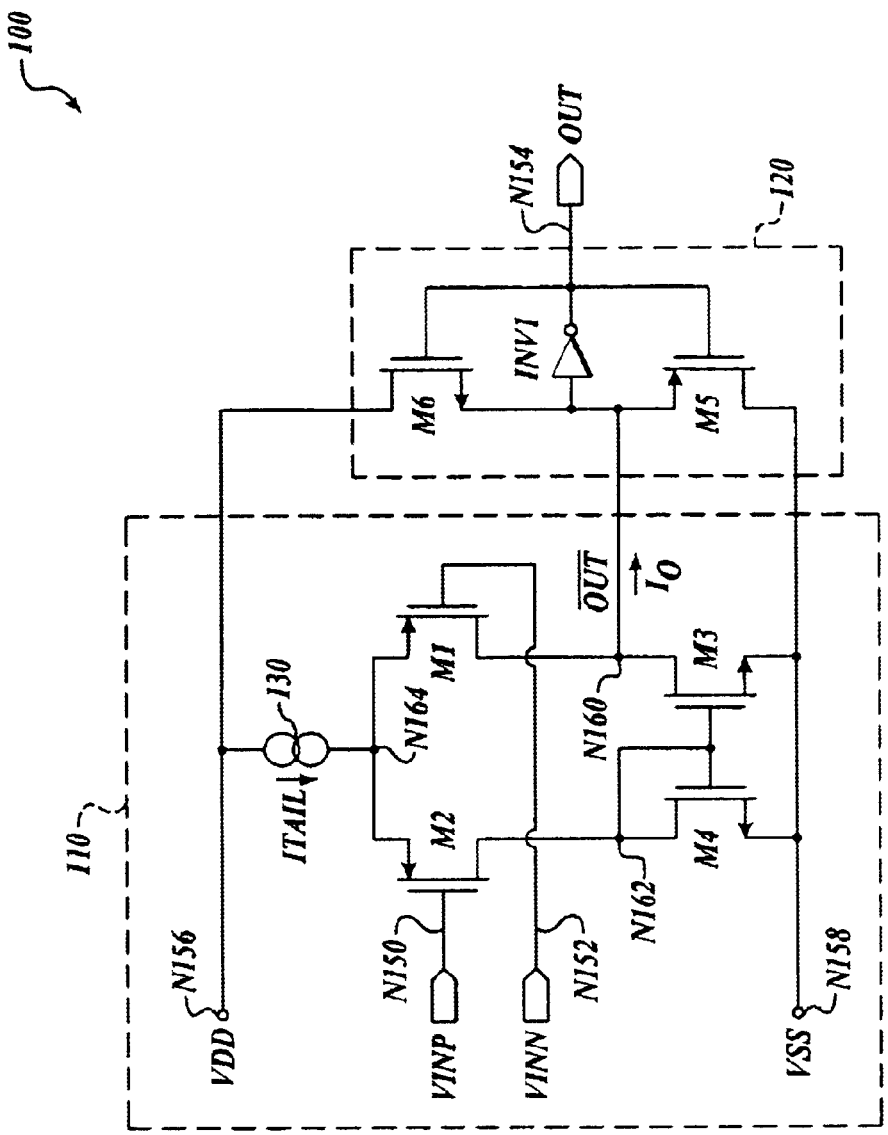
FIG. 1 is an illustration of an example embodiment of a circuit for converting a differential low-voltage signal into a single-ended signal.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a method and system that converts a differential low-voltage input signal (e.g. LVDS or RSDS) into a single-ended output signal. An operational trans-conductance amplifier (OTA) is configured to convert the input signal into a current. A trans-impedance stage is configured to convert the current into the single-ended output signal. The voltage associated with the output of the OTA corresponds to approximately VDD/2. The trans-impedance stage comprises an inverter circuit, a p-type transistor, and an n-type transistor. The transistors are arranged in a negative feedback configuration with the inverter. The single-ended output signal has a voltage swing that approximately corresponds to the sum of the $V_{GS}$ of the n-type transistor and the $V_{GS}$ of the p-type transistor. The output signal may be buffered by additional circuits such as an inverter, a Schmitt trigger, as well as others.

FIG. 1 is an illustration of an example embodiment of a circuit (100) for converting a differential low-voltage signal into a single-ended signal that is arranged in accordance with aspects of the present invention. Circuit 100 comprises an OTA (110) and a trans-impedance stage (120). An example OTA 110 comprises a current source (130) and transistors (M1–M4). Trans-impedance stage 120 comprises an inverter circuit (Inv1) and transistors (M5–M6).

Transistor M1 has a gate that is coupled to node N152, a drain that is coupled to node N160, and a source that is coupled to node N164. Transistor M2 has a gate that is coupled to node N150, a drain that is coupled to node N162, and a source that is coupled to node N164. Transistor M3 has a gate that is coupled to node N162, a drain that is coupled to node N160, and a source that is coupled to node N158. Transistor M4 has a gate that is coupled to node N162, a drain that is coupled to node N162, and a source that is coupled to node N158. Transistor M5 has a gate that is coupled to node N154, a drain that is coupled to node N158, and a source that is coupled to node N160. Transistor M6 has a gate that is coupled to node N154, a drain that is coupled to node N156, and a source that is coupled to node N160. Current source 130 is coupled between nodes N156 and N164. Inverter circuit Inv1 has a first input that is coupled to node N160 and an output that is coupled to node N154.

Circuit 100 is arranged to operate as follows below. A first supply signal (VSS) is applied at node N158, and a second supply signal (VDD) is applied at node N156. An input signal (Vdiff) is applied across nodes N150 and N152. Signal Vdiff corresponds to a differential signal (e.g. LVDS or RSDS). Signal Vdiff comprises a first half (Vinp) and a second half (Vinn) such that Vinp−Vinn=Vdiff, where Vinp is applied at node N150 and Vinp is applied at node N152.

Transistors M1 and M2 are arranged to operate as a differential pair. Transistors M3 and M4 are arranged in a current mirror configuration. The trans-impedance circuit is configured to maintain node N160 at approximately VDD/2 (halfway between the power supply rails). Current source 130 is configured to provide a tail current (Itail) for the differential pair at node N164. OTA 110 is arranged to provide an intermediate current ($I_O$) from node N160 to trans-impedance stage 120 in response to the differential signal (Vdiff). Current $I_O$ is approximately given by $I_O=\text{Vdiff}*gm_{1,2}$.

Trans-impedance stage 120 is configured to provide an output signal (OUT) at node N154 in response to current $I_O$. Trans-impedance stage 120 is further configured to servo the voltage associated with node N160 (VOUTB) to approximately VDD/2 such that inverter circuit Inv1 is biased at a mid-supply level. Accordingly, inverter circuit Inv1 is configured to operate as a trans-impedance amplifier. Trans-impedance stage 120 is arranged such that transistor M5 is active when current 10 is positive, and transistor M6 is active when current $I_O$ is negative. Transistors M5 and M6 are arranged to operate as source followers when active. The voltage associated with signal OUT (VOUT) is approximately given by: VOUT=VDD/2 +$VGS_5$ when $I_O$ is positive, and VOUT=VDD/2+$VSG_6$ when $I_O$ is negative. Accordingly, the voltage swing associated with signal OUT corresponds to $VGS_5$ +$VSG_6$. In one example, ($VGS_5$ +$VSG_6$) corresponds to approximately 1.8 V, and the voltage range associated with the power supplies is up to 2.5 V, and the circuit can directly drive a normal inverter. For power supplies greater than 3.0 V the circuit may be followed by an inverter with hysteresis.

The speed associated with operation of circuit 100 is adversely impacted by a parasitic capacitance (Cpar1) that is present at node N160. Changes in the voltage associated with node N160 is given by: $\Delta V=I_O*\Delta t/\text{Cpar1}$. Accordingly, the time ($\Delta t$) required to discharge node N160 is given by $\Delta t=\text{Cpar1}*\Delta V/I_O$. VOUTB is maintained at an approximately constant level such that $\Delta V$ is small. Accordingly, circuit 100 is configured to perform conversion of the logic levels from differential to single-ended at high speeds.

Inverter circuit Invi is biased approximately in the middle of the power supply rails (VDD, VSS). The sizes of the transistors in inverter circuit Inv1 are selected such that the quiescent current in Inv1 is within a tolerable limit, and is capable of driving the gate capacitance associated with transistors M5 and M6, as well as any subsequent circuits.

Figure 2:
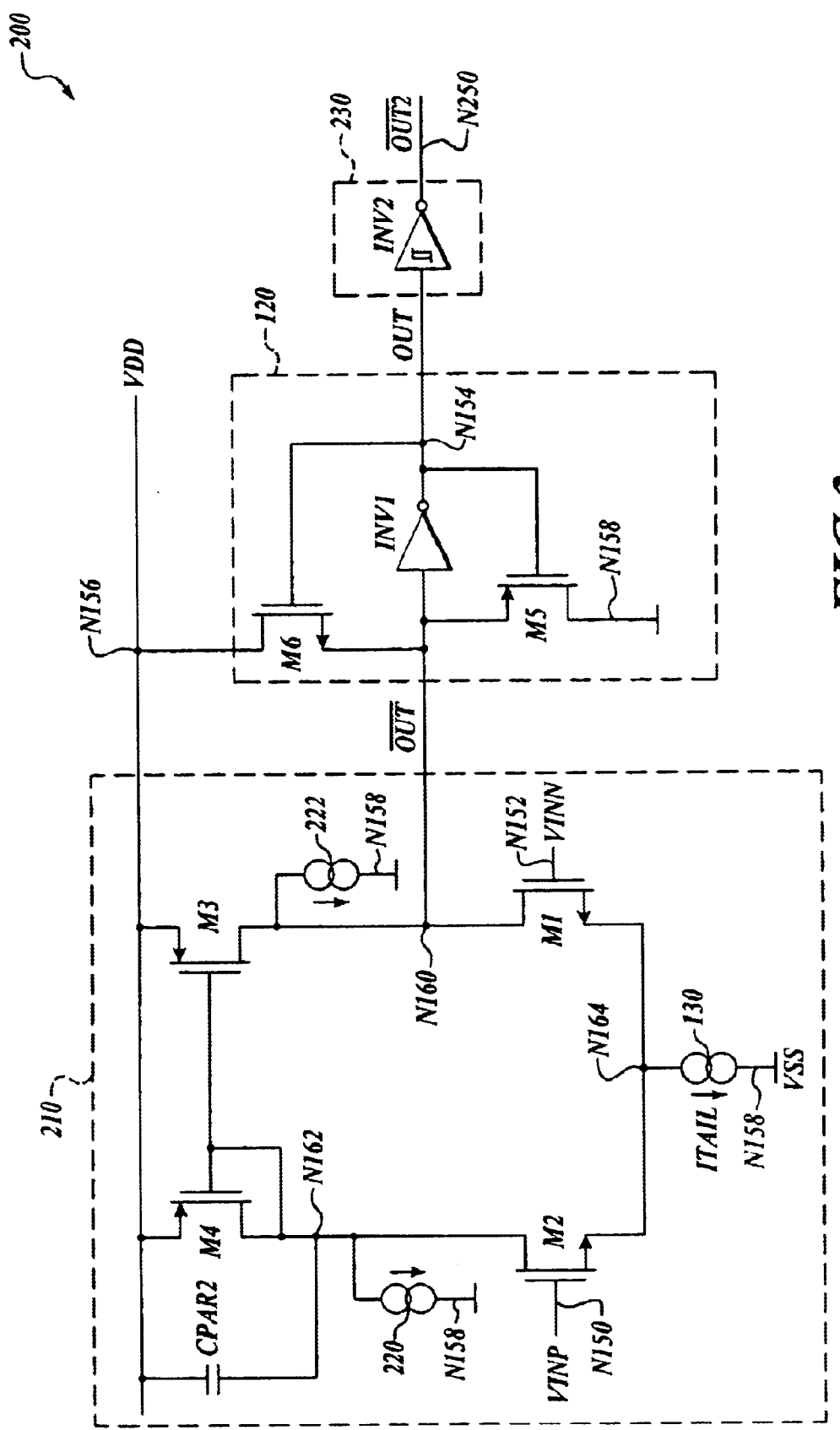
FIG. 2 is an illustration of another example embodiment of a circuit for converting a differential low-voltage signal into a single-ended signal.

FIG. 2 is an illustration of another example embodiment of a circuit (200) for converting a differential low-voltage signal into a single-ended signal that is arranged in accordance with aspects of the present invention. Circuit 200 comprises an OTA (210), a trans-impedance stage (120), and a buffer circuit (230). An example buffer circuit 230 comprises an inverter circuit (Inv2). An example OTA 210 comprises current sources (130, 220, and 222) and transistors (M1–M4). Trans-impedance stage 120 comprises an inverter circuit (Inv1) and transistors (M5–M6).

Transistor M1 has a gate that is coupled to node N152, a drain that is coupled to node N160, and a source that is coupled to node N164. Transistor M2 has a gate that is coupled to node N150, a drain that is coupled to node N162, and a source that is coupled to node N164. Transistor M3 has a gate that is coupled to node N162, a drain that is coupled to node N160, and a source that is coupled to node N156. Transistor M4 has a gate that is coupled to node N162, a drain that is coupled to node N162, and a source that is coupled to node N156. Transistor M5 has a gate that is coupled to node N154, a drain that is coupled to node N158, and a source that is coupled to node NI60. Transistor M6 has a gate that is coupled to node NI54, a drain that is coupled to node N156, and a source that is coupled to node N160. Current source 130 is coupled between nodes N158 and N164. Current source 220 is coupled between nodes N158 and N162. Current source 222 is coupled between nodes N158 and N160. Inverter circuit Inv1 has an input that is coupled to node N160 and an output that is coupled to node N154. Inverter circuit Inv2 has an input that is coupled to node N154 and an output that is coupled to node N250.

Circuit 200 is configured to operate in a substantially similar manner as circuit 100. OTA 210 includes an n-type differential pair instead of a p-type differential pair. Also, circuit 200 includes an optional buffer circuit (230) and two additional current sources (220, 222) that are not shown in FIG. 1.

Current source 220 is configured to provide current at node N162. When the polarity of the differential input signal (Vinp, Vinn) changes, transistor M2 becomes inactive and the voltage at node N162 is pulled to VDD by M4 and parasitic leakage. When the differential input signals (Vinp, Vinn) change polarity again, transistor M4 will not operate properly until a parasitic capacitance (Cpar2) associated with node N162 is charged. Current source 210 is configured to provide current at node N162 to maintain a charge on the parasitic capacitance (Cpar2). By maintaining a charge on the parasitic capacitance (Cpar2), operation of circuit 200 is enhanced and prevented from slowing down. Current source 222 is configured to provide a current at node N160 that matches the current provided by current source 220 at node N158, such that offset in the OTA is minimized.

The buffer circuit (e.g., Inv2) is configured to provide a buffered output signal (OUT2B) in response to the output signal (OUT). As discussed previously with respect to FIG. 1, the output signal (OUT) has a voltage swing that corresponds to $VGS_5+VSG_6$. Buffer circuit 230 is arranged to improve the rail-to-rail performance of the buffered output signal (OUT2B). Buffer circuit 230 also provides additional gain to the output. One example buffer circuit (230) comprises an inverter. Another example comprises an even number of inverters couple together in series such that the output is non-inverting with respect to node N154. Yet another example comprises an odd number of inverters couple together in series such that the output is inverting with respect to node N154. Still another example buffer circuit (230) comprises a Schmitt trigger, as illustrated in FIG. 2. The quiescent current that is associated with the buffer circuit (230) may be reduced when the Schmitt trigger is used.

Figure 3:
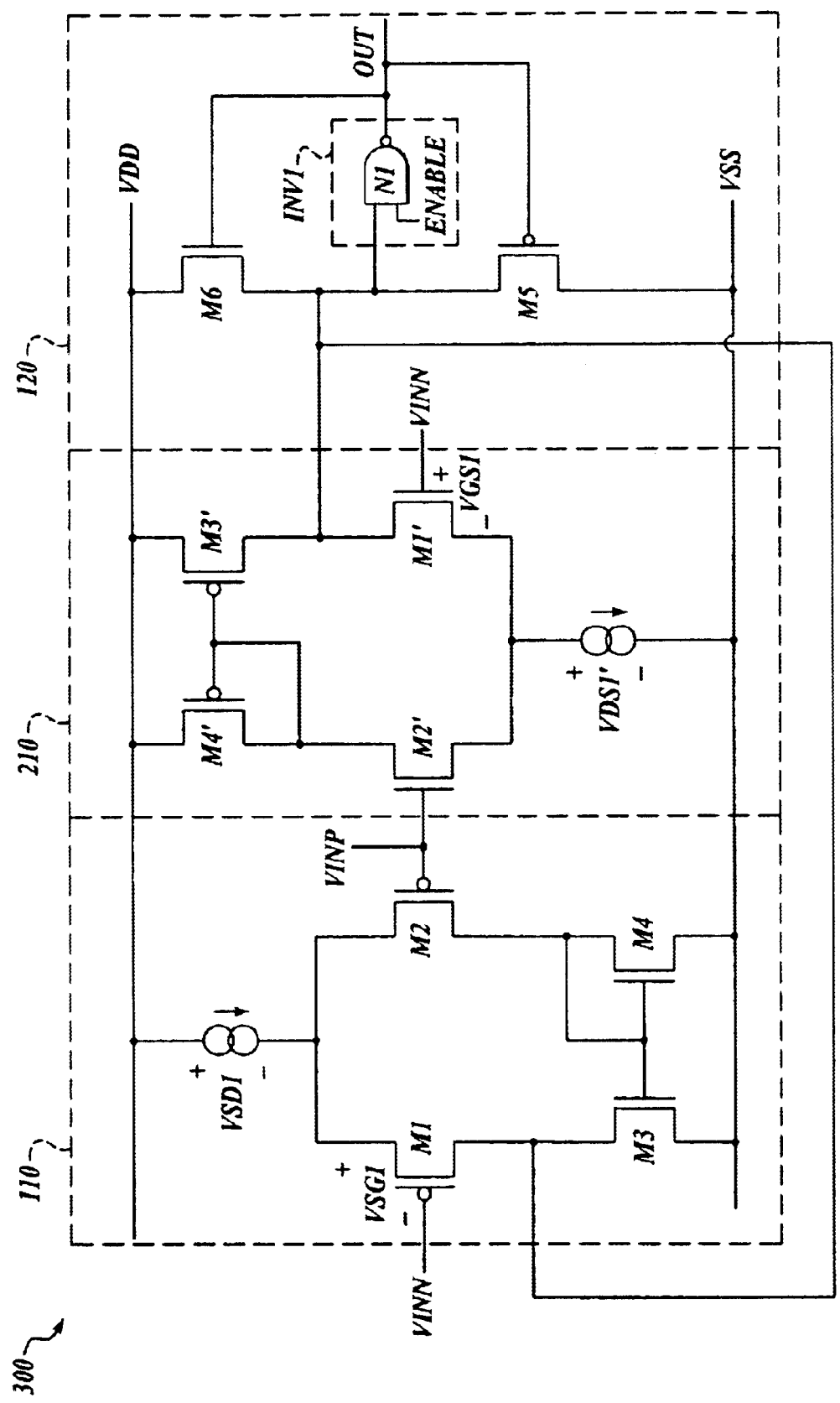
FIG. 3 illustrates yet another example embodiment of a circuit for converting a differential low-voltage signal into a single-ended signal, using a rail-to-rail implementation.

FIG. 3 illustrates yet another example embodiment of a circuit (300) for converting a differential low-voltage signal into a single-ended signal, using a rail-to-rail implementation, which is arranged in accordance with aspects of the present invention. Circuit 300 comprises a first OTA (110), a second OTA (210), and a trans-impedance stage (120). Circuit 300 operates in a substantia 100 and circuit 200. OTA 110 is configured to operate with a common mode voltage that is in the range from VSS to (VDD−$VDS_7$−$VSG_1$). OTA 210 is configured to operate with a common mode voltage that is in the range from VDD to (VSS+$VDS_7$'+$VGS_1$'). By including OTA 110 and OTA 210, rail-to-rail performance of circuit 300 is enhanced.

Circuit 300 illustrates an example embodiment where circuit Inv1 comprises a NAND gate (N1). The first input of NAND gate N1 is coupled to node N160, while the second input is coupled to an ENABLE signal. NAND gate N1 is configured such that power is conserved when signal ENABLE is deactivated.

Figure 4:
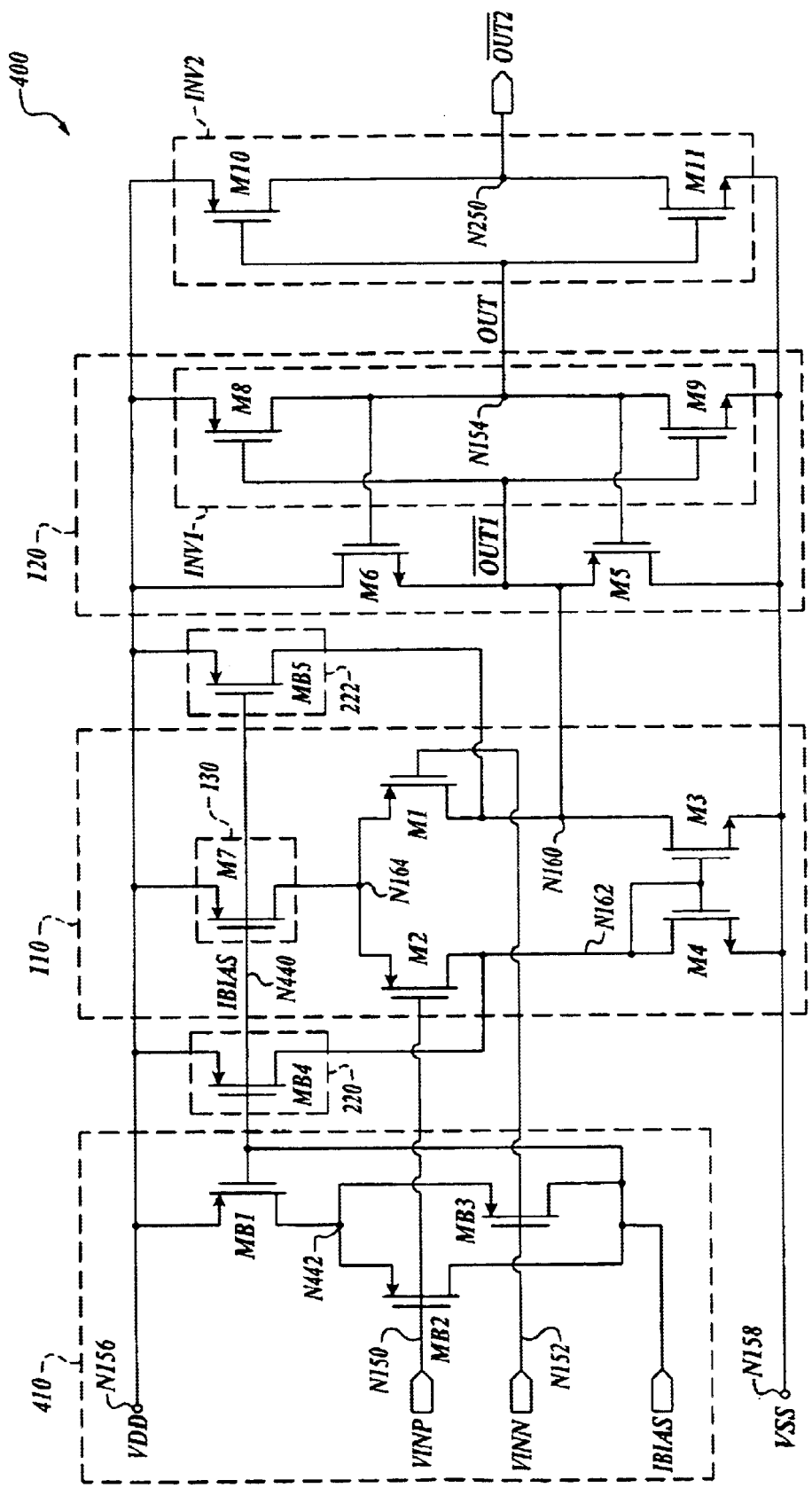
FIG. 4 is an illustration of still another example embodiment of a circuit for converting a differential low-voltage signal into a single-ended signal, arranged in accordance with aspects of the present invention.

FIG. 4 is an illustration of still another example embodiment of a circuit (400) for converting a differential low-voltage signal into a single-ended signal that is arranged in accordance with aspects of the present invention. Circuit 100 comprises an OTA (110), trans-impedance stage (120), an inverter circuit (Inv2), current source (220 and 222), and a bias circuit (410). An example bias circuit (410) includes transistors (Mb1–Mb3). An example OTA 110 comprises a current source (130) and transistors (M1–M4). Trans-impedance stage 120 comprises an inverter circuit (Inv1) and transistors (M5–M6). An example of inverter circuit Inv1 includes transistors (M8–M9). An example of inverter circuit Inv2 comprises transistors (M10–M11). An example of current source 130 comprises a transistor (M7). An example of current source 220 comprises a transistor (Mb4). An example of current source 222 comprises a transistor (Mb5).

Transistor M1 has a gate that is coupled to node N152, a drain that is coupled to node N160, and a source that is coupled to node N164. Transistor M2 has a gate that is coupled to node N150, a drain that is coupled to node N162, and a source that is coupled to node N164. Transistor M3 has a gate that is coupled to node N162, a drain that is coupled to node N160, and a source that is coupled to node N158. Transistor M4 has a gate that is coupled to node N162, a drain that is coupled to node N162, and a source that is coupled to node N158. Transistor M5 has a gate that is coupled to node N154, a drain that is coupled to node N158, and a source that is coupled to node N160.

Transistor M6 has a gate that is coupled to node N154, a drain that is coupled to node N156, and a source that is coupled to node N160. Transistor M7 has a gate that is coupled to node N440, a drain that is coupled to node N164, and a source that is coupled to node N156. Transistor M8 has a gate that is coupled to node N160, a drain that is coupled to node N154, and a source that is coupled to node N156. Transistor M9 has a gate that is coupled to node N160, a drain that is coupled to node N154, and a source that is coupled to node N158. Transistor M10 has a gate that is coupled to node N154, a drain that is coupled to node N250, and a source that is coupled to node N156. Transistor M11 has a gate that is coupled to node N154, a drain that is coupled to node N250, and a source that is coupled to node N158.

Transistor Mb1 has a gate that is coupled to node N440, a drain that is coupled to node N442, and a source that is coupled to node N156. Transistor Mb2 has a gate that is coupled to node N150, a drain that is coupled to node N440, and a source that is coupled to node N442. Transistor Mb3 has a gate that is coupled to node N152, a drain that is coupled to node N440, and a source that is coupled to node N442. Transistor Mb4 has a gate that is coupled to node N440, a drain that is coupled to node N162, and a source that is coupled to node N156. Transistor Mb5 has a gate that is coupled to node N440, a drain that is coupled to node N160, and a source that is coupled to node N156.

Circuit 400 is configured to operate in a substantially similar manner as circuit 100. Bias circuit 410 is configured to enhance the common mode voltage (VCM) range of circuit 400. As the common mode voltage changes, the VDS of M7 changes. To accurately mirror the current from Mb1 to M7 their VDS's must match. Mb2 and Mb1 maintain the VDS of Mb1 equal to M7. This maintains the current through M7 at the proper value even if M7 goes out of saturation at high common mode voltages The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for converting a differential signal to a single-ended output signal, wherein the apparatus is operated from first and second power supplies, the apparatus comprising:

a differential pair circuit that is configured to provide an intermediate signal in response to the differential signal;

a current mirror circuit that is coupled to the differential pair circuit such that the current mirror circuit is a load for the differential pair circuit, wherein the current mirror circuit is arranged such that a voltage associated with the intermediate signal approximately corresponds to an arithmetic mean of the first power supply voltage and the second power supply voltage; and a first current source circuit that is coupled to the differential pair circuit such that the first current source provides a tail current to the differential pair circuit; and a trans-impedance circuit that is configured to operate from the first power supply voltage and the second power supply voltage, wherein the trans-impedance stage comprises:

a first inverter circuit having a first inverter input and a first inverter output, wherein the first inverter input is configured to receive the intermediate signal and the first inverter output is configured to provide an output signal that is responsive to the intermediate signal;

a first transistor having a first gate, a first drain, and a first source, wherein the first gate is coupled to the first inverter output, the first drain is coupled to the first power supply, and the first source is coupled to the first inverter input, and a second transistor having a second gate, a second drain, and a second source, wherein the second gate is coupled to the first inverter output, the second drain is coupled to the second power supply, and the second source is coupled to the first inverter input.

2. The apparatus of claim 1 further comprising: a second current source and a third current source, wherein the current mirror circuit comprises a third transistor and a fourth transistor, wherein the fourth transistor is arranged to operate as a diode, wherein the second current source is configured to provide a first current to the third transistor, such that a drain-to-source voltage associated with the third transistor is maintained, and wherein the third current source is configured to provide a second current to the fourth transistor such that current mirror is operable for higher speed differential signals.

3. The apparatus of claim 2, further comprising a bias circuit that is arranged to adjust the tail current, the first current, and the second current in response to a common-mode voltage associated with the differential signal.

4. The apparatus of claim 2, further comprising a bias circuit that is arranged to provide a bias signal in response to a common-mode voltage associated with the differential signal, wherein the differential pair circuit comprises a fifth transistor and a sixth transistor that include common sources that are coupled to the first current source, wherein the first current source includes a seventh transistor, the second current source includes an eighth transistor, and the third current source includes a ninth transistor, wherein the seventh, eighth, and ninth transistors are biased by the bias signal, wherein the bias circuit comprises a tenth transistor, an eleventh transistor, and a twelfth transistor, wherein the gate of the tenth transistor is coupled to the bias signal, and the drain of the tenth transistor is coupled to the sources of the eleventh and twelfth transistors, and wherein the gates associated with the fifth, sixth, eleventh, and twelfth transistors are associated with the differential signal.

5. An apparatus for converting a differential signal to a single-ended output signal, wherein the apparatus is operated from first and second power supplies, the apparatus comprising:

an operational trans-conductance amplifier having an amplifier input and an amplifier output, wherein: the operational trans-conductance amplifier is configured to operate from the first power supply and the second power supply, the amplifier input is arranged to receive the differential signal, and the amplifier output is arranged to provide an intermediate signal that is responsive to the differential signal; and a trans-impedance stage that is configured to operate from the first and second power supplies, wherein the trans-impedance stage is arranged in cooperation with the operational trans-conductance amplifier such that a voltage associated with the intermediate signal approximately corresponds to an arithmetic mean of the first and second power supplies, wherein the trans-impedance stage comprises:

a first inverter circuit having a first inverter input that is coupled to the amplifier output, and a first inverter output that is configured to provide an output signal that is responsive to the intermediate signal;

a first transistor having a first gate that is coupled to the output signal, a first drain that is coupled to the first power supply, and a first source that is coupled to the first inverter input; and a second transistor having a second gate that is coupled to the output signal, a second drain that is coupled to the second power supply, and a second source that is coupled to the first inverter input.

6. The apparatus of claim 5, wherein the first inverter circuit comprises at least one of an inverter gate and a NAND gate.

7. The apparatus of claim 5 further comprising a buffer circuit, wherein the buffer circuit is configured to buffer the output signal to provide a buffered output signal.

8. The apparatus of claim 7, wherein the buffer circuit comprises at least one of an inverter and a Schmitt trigger.

9. The apparatus of claim 5, wherein the operational trans-conductance amplifier circuit comprises:
a differential pair circuit comprising a third transistor and a fourth transistor, wherein the differential pair is configured to receive the differential signal;
a current mirror circuit comprising a fifth transistor and a sixth transistor, wherein the sixth transistor is configured to operate as a diode; and
a first current source that is configured to provide a tail current to the differential pair; and the apparatus further comprising a second current source that is configured to provide a current to the sixth transistor at least when the fourth transistor is inactive such that the operational trans-conductance amplifier is operable for rapid polarity changes in the differential signal.

10. The apparatus of claim 5:

wherein the operational trans-conductance amplifier circuit comprises:
a differential pair circuit comprising a third transistor and a fourth transistor, wherein the differential pair is configured to receive the differential signal, wherein the third and fourth transistors have third and fourth gates and drains, respectively;
a current mirror circuit comprising a fifth transistor and a sixth transistor, wherein the sixth transistor is configured to operate as a diode; and
a first current source that is configured to provide a tail current to the differential pair, wherein the first current source comprises a seventh transistor having a seventh gate and a seventh source; and the apparatus further comprising:
an eighth transistor having an eighth gate that is coupled to the seventh gate, an eighth source is coupled to the seventh source, and an eighth drain;
a ninth transistor having a ninth gate that is coupled to the fourth drain, a ninth source that is coupled to the eighth drain, and a ninth drain that is coupled to the eighth gate; and
a tenth transistor having a tenth gate that is coupled to the third gate, a tenth source that is coupled to the ninth source, and a tenth drain that is coupled to the eighth gate.

11. The apparatus of claim 5, wherein the first transistor is an n-type transistor and the second transistor is a p-type transistor.

12. The apparatus of claim 5, wherein the inverter circuit is sized to reduce current associated with the output signal.

13. The apparatus of claim 5, wherein a voltage difference associated with the first power supply and the second power supply corresponds to approximately 2.5 volts.

14. An apparatus for converting a differential signal to a single-ended output signal, wherein the apparatus is operated from first and second power supplies, the apparatus comprising:

an operational trans-conductance means that is configured to provide a current to an intermediate node in response to the differential signal; and a trans-impedance means that is configured to provide an output voltage in response to the current such that the output voltage corresponds to: a sum of a voltage level and a gate-to-source voltage of a first transistor when the current has a negative polarity, a difference of the voltage level and a gate-to-source voltage of a second transistor when the current has a positive polarity, wherein the operational trans-conductance amplifier and the trans-impedance means are arranged in cooperation with one another such that a voltage associated with the intermediate node approximately corresponds to a mid-supply voltage.

15. The apparatus of claim 14, wherein a voltage difference between the first power supply and the second power supply corresponds to approximately 2.5 volts, and wherein the voltage level corresponds to approximately the half of the voltage difference.

16. The apparatus of claim 14, further comprising a means for buffering that is configured to buffer the output signal to provide a buffered output signal.

17. The apparatus of claim 14, wherein the trans-impedance means comprises:

a means for inverting that is configured to provide the output signal in response to an intermediate signal associated with the intermediate node by applying an inverting gain;

a first means for following that is configured to maintain the gate-to-source voltage between the intermediate signal and the output voltage when the first means for following is active, wherein the first means for following is active when the current has a negative polarity; and a second means for following that is configured to maintain the gate-to-source voltage between the intermediate signal and the output voltage when the second means for following is active, wherein the second means for following is active when the current has a positive polarity.

18. The apparatus of claim 15, further comprising a current source means that is arranged to maintain the operational trans-conductance means during high-speed operation.

19. The apparatus of claim 18, further comprising a biasing means that is arranged to adjust currents in the trans-conductance means and the current source means in response to a common-mode voltage that is associated with the differential signal.

20. The apparatus of claim 15, further comprising another operational trans-conductance means that is configured to provide another current to the intermediate node in response to the differential signal, wherein the operational trans-conductance means is arranged to operate a common-mode range, the other operational trans-conductance means is arranged to operate over another common-mode range, and the operational trans-conductance means and the other operational trans-conductance means are arranged to cooperate with one another to provide an intermediate signal at the intermediate node.

* * * * *